United States Patent [19]

Hansen

[11] Patent Number: 6,128,759
[45] Date of Patent: Oct. 3, 2000

[54] FLEXIBLE TEST ENVIRONMENT FOR AUTOMATIC TEST EQUIPMENT

[75] Inventor: Peter L. Hansen, Peabody, Mass.

[73] Assignee: Teradyne, Inc., Boston, Mass.

[21] Appl. No.: 09/045,436

[22] Filed: Mar. 20, 1998

[51] Int. Cl.[7] .................................................. G01R 31/28
[52] U.S. Cl. ............................ 714/738; 700/121; 714/47
[58] Field of Search ............................ 714/32, 712, 738,
714/741, 821, 825; 710/101, 125, 129,
243; 709/200, 201–203, 217–219, 227,
237

[56] References Cited

U.S. PATENT DOCUMENTS

| | | | |
|---|---|---|---|
| 5,159,685 | 10/1992 | Kung ......................................... | 714/26 |
| 5,337,320 | 8/1994 | Kung ......................................... | 714/26 |
| 5,371,851 | 12/1994 | Pieper et al. ............................. | 345/507 |
| 5,421,004 | 5/1995 | Carpenter et al. ........................ | 714/25 |
| 5,544,316 | 8/1996 | Carpenter et al. ...................... | 709/300 |
| 5,673,272 | 9/1997 | Proskauer et al. ...................... | 714/724 |

OTHER PUBLICATIONS

START: System Testability Analysis and Research Tool, Pattipati, et al., IEEE, Jan. 1991.

Scalable and Efficient Broadcasting Algorithms for Very Large Internetworks, Chatterjee, et al., IEEE, Apr. 1996.

Future Automatic Test Equipment, Gartner, et al., IEEE, Sep. 1988.

SEDACS–a client/server approach to TPS development, Burrus, IEEE, Aug. 1995.

Using Microsoft Windows 3, 2d Edition, Rose, et al., pp. 110, 116, 126, 127, 343, 369, 386, 1990.

*Instrumentation Newsletter*™, Technical News from National Instruments™, vol. 10, No. 1, Spring 1998.

*Image*™ Answers On–Line Documentation System, Teradyne™, Inc., 1995.

*Primary Examiner*—Albert De Cady
*Assistant Examiner*—Guy Lamarre

[57] ABSTRACT

A flexible test environment for automatic test equipment, whereby sequences of steps for developing and executing test programs are specified using hierarchical trees of nodes. The nodes in one tree include end leaves that correspond with the test program development steps, and the nodes in another tree include end leaves that correspond with the test program execution steps. Further, the end leaves in both trees have a plurality of associated properties, which are used for specifying test program flow and for indicating methods to be called when the steps are executed. The test environment can be easily adapted to a distributed tester architecture.

12 Claims, 10 Drawing Sheets

FLEXIBLE TEST ENVIRONMENT FOR AUTOMATIC TEST EQUIPMENT

This invention relates generally to automatic test equipment, and more specifically to a software environment for facilitating the development, execution, and documentation of tests performed by automatic test equipment.

Automatic test equipment, also known as a tester, is commonly used to test both semiconductor devices and assembled printed circuit boards to determine whether the devices and boards are defective.

In general, a tester operator develops test signals and test sequences on the tester for subsequent testing of a unit under test (UUT), which may be either a semiconductor device or a printed circuit board. The tester operator then enters commands to start a test, thereby causing the tester to apply the test signals to the UUT and receive output signals produced by the UUT in response to the applied test signals. The tester then typically compares the received output signals with stored expected values. The tester also typically measures various parameters associated with the UUT, such as the amount of current drawn during various operating conditions or the frequency of various output signals, and then compares these values with other expected values. If any of the received signals or measured values do not match corresponding expected values, then the tester typically indicates that the UUT has defects.

The UUT may include just digital or analog circuitry, or both types of circuitry. A UUT that includes both types of circuitry is generally known as a mixed-signal device, and testers that test these devices are generally known as mixed-signal testers.

Such mixed-signal testers are commonly configured with a workstation and several instruments, which are connected to either nodes or primary inputs/outputs of the UUT. The workstation typically controls the instruments via a standard bus, and the instruments typically apply test signals to the UUT, acquire output signals from the UUT, and make any required measurements on the UUT. Some of the instruments may be only used for digital tests, while other instruments may be used just for analog tests. Still other instruments may be used for providing DC signals or power to the UUT. Further, the different instruments are frequently acquired from different instrument manufacturers.

Figure 1:
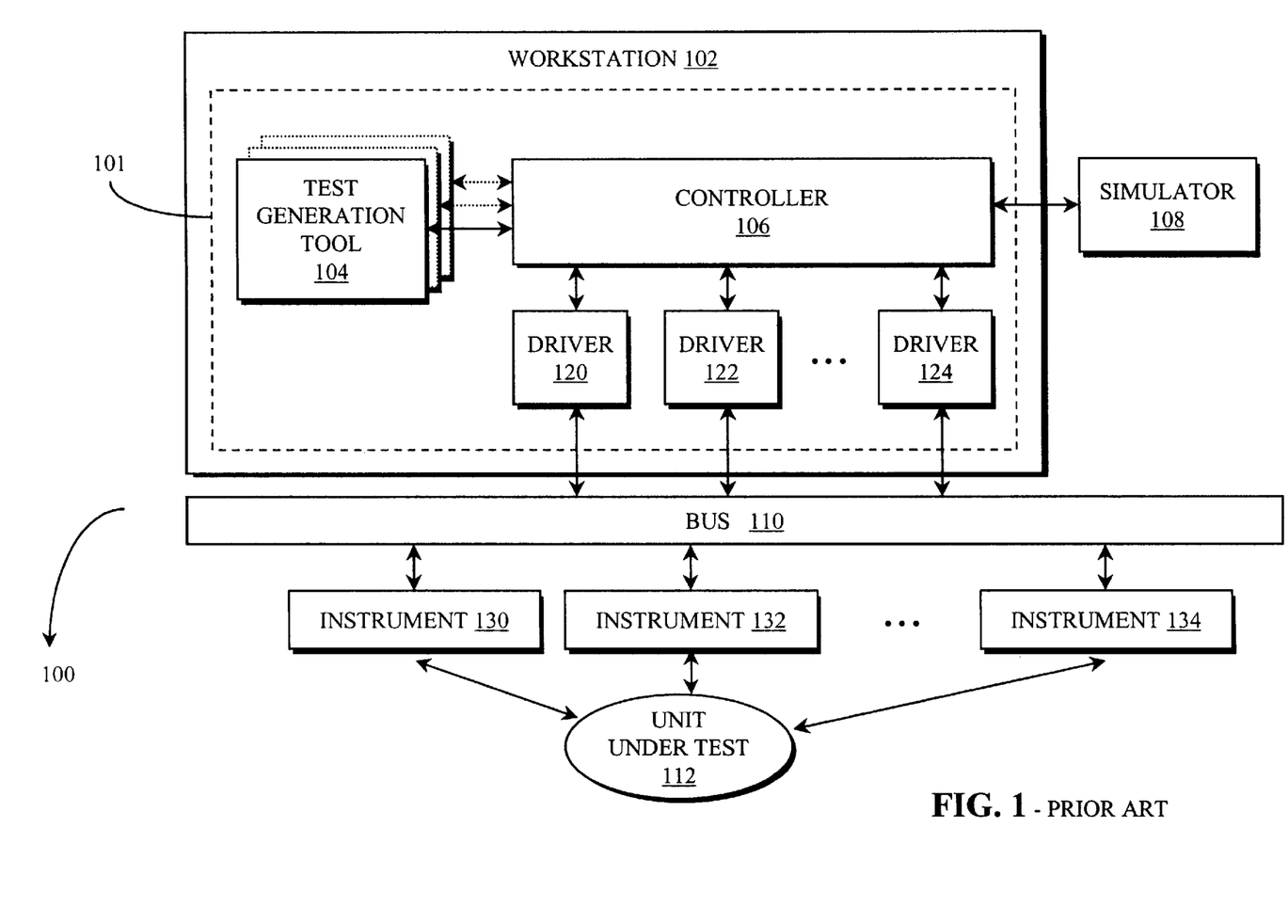
FIG. 1 is a block diagram of a tester in a conventional configuration.

FIG. 1 shows a block diagram of a tester 100, which includes a workstation 102 that controls a plurality of instruments such as instruments 130, 132, and 134 through a bus 110. Further, the instruments 130, 132, and 134 are coupled to nodes or primary inputs/outputs of a UUT 112.

The workstation 102 has a typical software configuration 101, which includes a controller module 106, a plurality of test generation tools such as a tool 104, and a plurality of instrument drivers 120, 122, and 124. Each of the software modules in the software configuration 101 might be created using a textual programming language such as C++ or BASIC. The software configuration 101 might alternatively be implemented using a graphical programming system such as the LabVIEW® system sold by National Instruments Corporation, Austin, Tex., USA, or the HP VEE™ system sold by Hewlett-Packard Company, Palo Alto, Calif., USA. In this case, the controller module 106 typically implements a user interface on a display monitor (not shown), and the tester operator typically specifies tests to be performed on the UUT 112 by manipulating graphical representations on the display monitor using an input device (not shown) such as a keyboard or mouse. It is generally recognized that computer-based systems that deal with information in a graphical or visual manner are more desirable than those that rely on textual formats.

The drivers 120, 122, and 124 communicate with respective instruments 130, 132, and 134 via the bus 110, which is generally compatible with an interface standard such as HP-IB (IEEE-488), VMEbus, or VXIbus (VMEbus Extensions for Instrumentation). Further, because the UUT 112 may include digital or analog circuitry or both, some of the instruments 130, 132, and 134 may be suited for transmitting/receiving digital signals while other instruments may only deal with analog signals. Still other instruments may provide any necessary DC signals or power to the UUT 112.

During a typical test session, the tester operator uses the test generation tools for specifying digital and/or analog test signals and corresponding expected values. The digital test signals may be applied to a simulator 108, which typically simulates the logic functionality of the UUT 112 and provides patterns of expected output data to the workstation 102. These patterns reflect the output signals that would be produced by a properly functioning UUT in response to the digital test signals. The tester operator then typically saves the specified test signals and corresponding expected values in a database (not shown) included in the workstation 102.

The tester operator also uses the test generation tools for specifying sequences of steps to be performed when testing the UUT 112. For example, steps in a simplified test sequence may include first applying power to the UUT 112. Next, various digital tests may be performed on the UUT 112 followed by analog tests, or vice versa. The final step in the test sequence may include removing power from the UUT 112.

Although the tester 100 has been successfully used for testing semiconductor devices and printed circuit boards, it has some drawbacks. For example, it was described that it is frequently necessary to develop both analog and digital tests for mixed-signal devices or boards. This means that different sequences of steps must be followed in both the development and the execution of the analog and digital tests. Further, the increasing densities of semiconductor devices and printed circuit boards have added a high-level of complexity to the development of such test sequences.

However, the tester 100 lacks features for facilitating the development and execution of these complex test sequences. For example, it was mentioned that graphical programming systems such as LabVIEW® and HP VEE™ might be used to implement the typical software configuration 101. Such graphical programming systems can be used to implement both user interfaces and test sequences. In particular, the user interfaces might include graphs, drop-down lists, pop-up menus, and graphical representations of knobs, switches, and slides. Further, the test sequences might be graphically represented by block diagrams.

But, these graphical programming systems are primarily useful for specifying test sequences as lists of steps. They are not particularly useful for grouping related steps or for specifying which groups of steps are to be performed in a test. Also, they generally lack features for specifying steps or parameters that might be common to different groups of steps. Also, they generally do not clearly convey the organization of test sequences involving such groups of steps through the user interface. We have recognized that these drawbacks restrict the tester operator's ability to develop and execute tests for complex devices and boards such as those having both digital and analog circuitry.

Further, the tester 100 lacks features for facilitating the access of documentation relating to a test. Although testers designed using the LabVIEW® and HP VEE™ graphical programming systems include features for documenting the design and structure of test sequences, they generally do not have features for easily accessing user manuals and other documentation. They also generally do not clearly convey the organization of such documentation through the user interface.

Another drawback of the tester 100 is that the software modules included in the typical software configuration 101 cannot be easily interfaced with other software modules. This is because the software modules are generally implemented with non-standard software constructs such as dynamic link libraries (DLLs). The main shortcoming of such non-standard constructs is that they do not conform to any accepted standard interface. As a result, the software modules are usually dedicated to a particular type of tester and cannot be easily integrated with other testers. This also makes it difficult to add functionality to a tester.

We have also recognized the desirability of having a distributed tester architecture. For example, a local tester might perform test development and control functions while remote testers perform testing and analysis functions. In this way, one tester may be configured to control several other testers. Further, one or more testers might be dedicated to performing data analysis functions, thereby allowing other testers to focus upon collecting test data. Also, data from several testers might be consolidated in a single location.

However, because the software modules included in the typical software configuration 101 are generally implemented in a non-standard manner, they cannot be easily interfaced with applications that would allow such a distributed tester architecture.

It would therefore be desirable to have a tester that facilitates the development, execution, and documentation of complex test sequences. Such a tester would clearly communicate the organization and structure of these test sequences and related documentation to the tester operator through the user interface. It would also be desirable to have a tester that can be easily adapted to a distributed tester architecture.

SUMMARY OF THE INVENTION

With the foregoing background in mind, it is an object of the invention to provide a tester that facilitates the development, execution, and documentation of complex test sequences.

Another object of the invention is to provide a tester with a user interface that clearly communicates the organization and structure of complex test sequences and their related documentation.

Still another object of the invention is to provide a tester with a user interface that can be easily integrated with remote testers.

Yet another object of the invention is to provide a tester that can be easily adapted to a distributed tester architecture.

The foregoing and other objects are achieved by specifying a first hierarchical tree of nodes. The nodes in the first tree include at least one end leaf corresponding to a step in a sequence of steps for generating a test program. Next, a second hierarchical tree is specified. The nodes in the second tree include at least one end leaf corresponding to a step in a sequence of steps for executing a test program. The sequence of steps corresponding to the leaves in the first tree is then executed, thereby generating a test program. Further, the sequence of steps corresponding to the leaves in the second tree is executed, thereby executing the test program.

According to one feature, each end leaf in the first and second trees has a plurality of associated properties. At least one of the properties is used for indicating a method to be called during the execution of a corresponding step.

In another embodiment, a system for generating and executing test programs includes a local tester, at least one remote tester, and data transmission lines connecting the local tester with the remote tester. The local tester includes means for generating the test programs, and means for transmitting data representing the test programs to the remote tester. Further, the remote tester includes means for executing the test program.

According to one feature, the local tester and the remote tester exchange data representing the test program and test results through a network, such as a corporate Intranet or the public Internet.

Still further objects and advantages will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

Figure 2A:
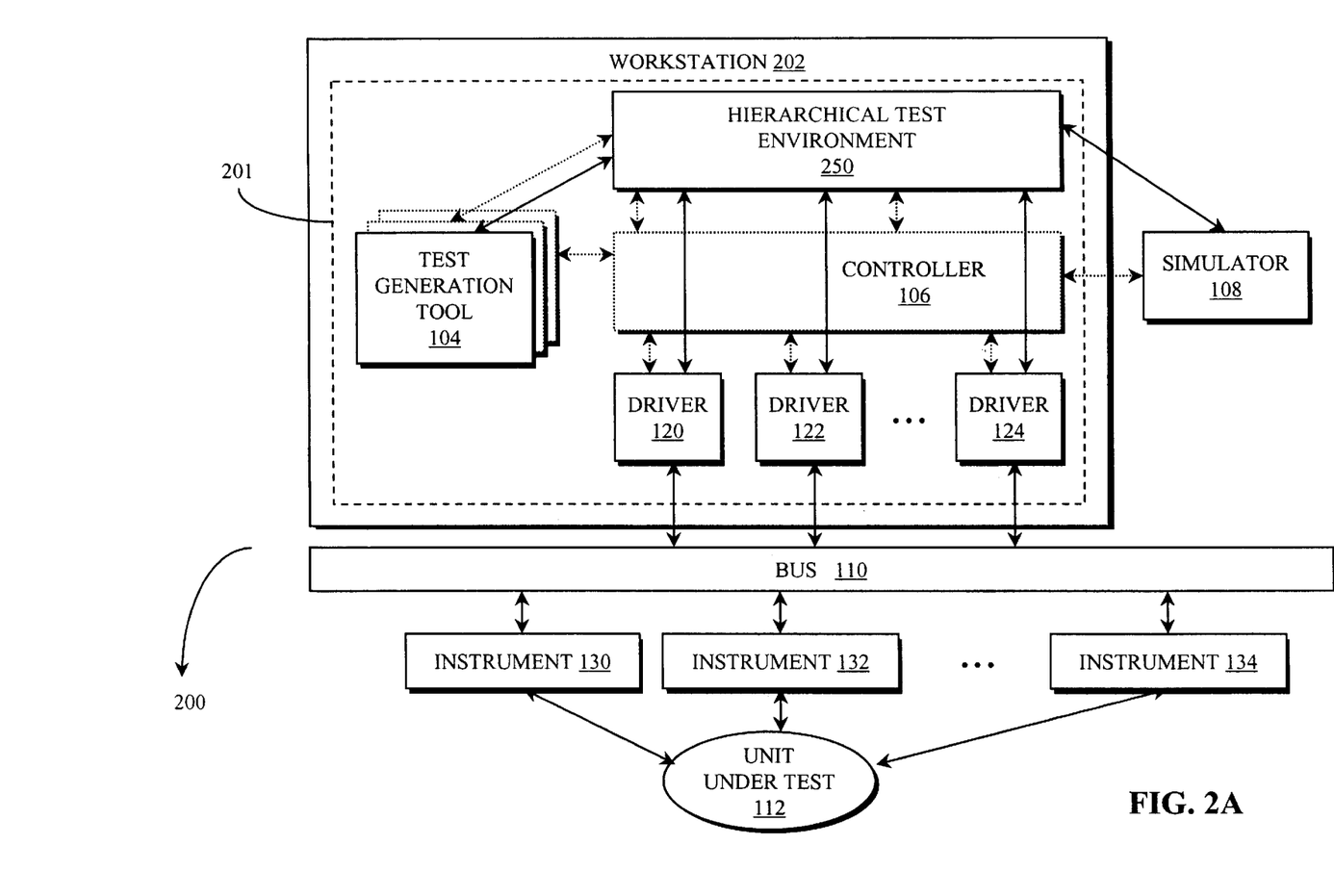
FIG. 2A is a block diagram of a tester in accordance with the present invention.

FIG. 2A shows a partial block diagram of a tester 200 in accordance with the present invention. The tester 200 is expected to be marketed as the TestStudio™ test system by TERADYNE®, Inc., Boston, Mass., USA.

As shown in FIG. 2A, a workstation 202 controls a plurality of individual instruments 130, 132, and 134 through a standard bus interface 110. Further, the instruments 130, 132, and 134 are connected to nodes or primary inputs/outputs of a unit under test (UUT) 112, which may be either a semiconductor device or an assembled printed circuit board. The workstation 202 may control the instruments 130, 132, and 134 to apply test signals to the UUT 112, to acquire output signals generated by the UUT 112, and/or to make any level or timing measurements on the UUT 112. The instruments 130, 132, and 134, and the bus interface 110 are known to those skilled in this art.

The UUT 112 may include either digital or analog circuitry, or both. Accordingly, some of the instruments 130, 132, and 134 are used only for digital tests, while other instruments are used only for analog tests. Still other instruments are used to provide DC signals or power to the UUT 112. Further, the instruments 130, 132, and 134 communicate with the workstation 202 in a conventional manner via the bus 110, which is preferably compatible with a standard interface such as HP-IB (IEEE-488), VMEbus, or VXIbus.

The workstation 202 has a software configuration 201, which includes a hierarchical test environment 250 along with various known software modules including, but not limited to, test generation tools, namely, tool 104, a controller module 106, and a plurality of instrument drivers 120, 122, and 124. The tester 200 may also include a simulator 108, such as the LASAR™ simulator sold by TERADYNE®, Inc. The simulator 108 preferably communicates directly with the test environment 250. Alternatively, the simulator 108 may communicate with the test environment 250 via the controller module 106. An advantage of the present invention is that the test environment 250 facilitates the development, execution, and documentation of complex test sequences using known software modules such as the test generation tool 104, the controller module 106, the drivers 120, 122, and 124, and the simulator 108.

Figure 2B:
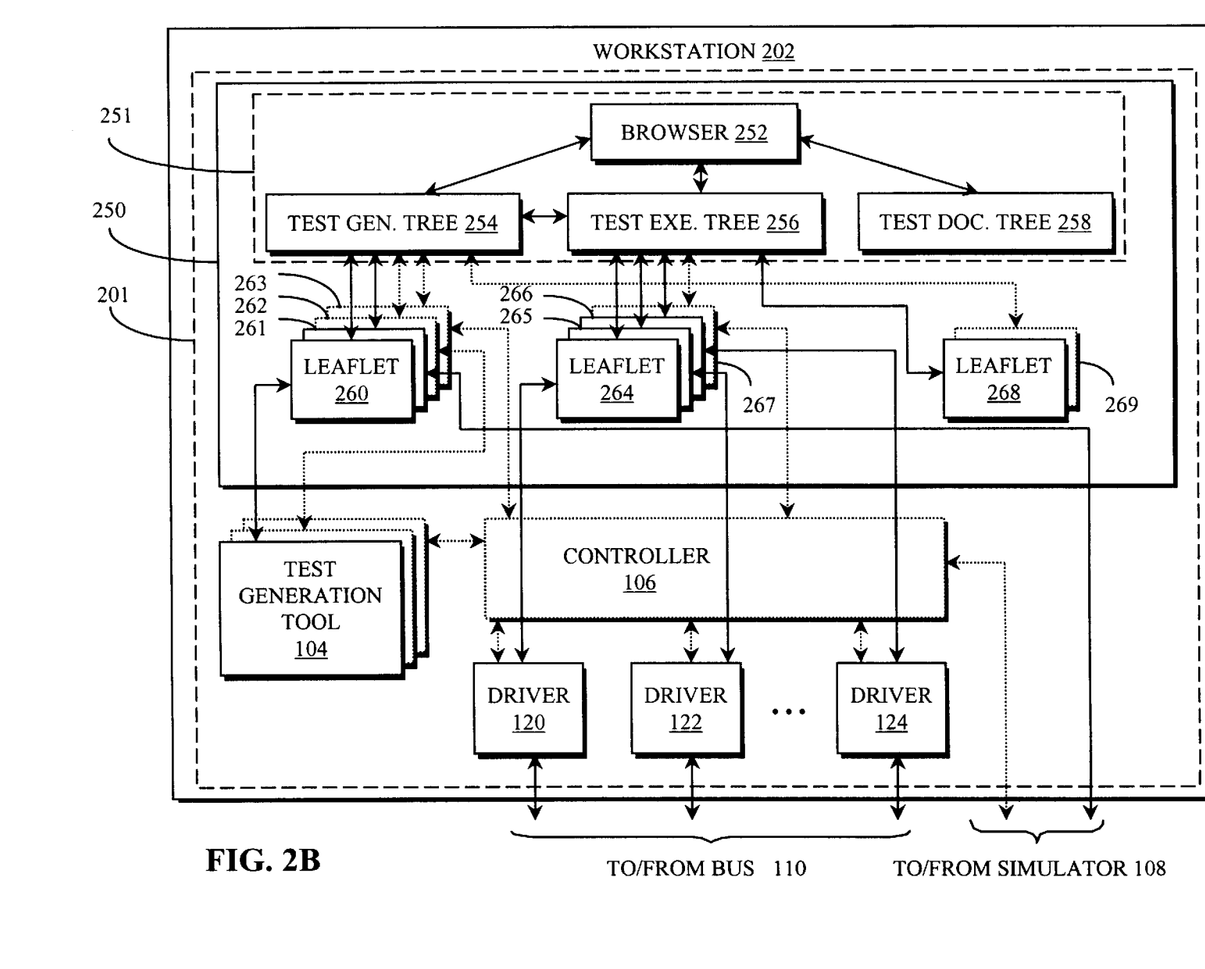
FIG. 2B is a block diagram of a software configuration used with the FIG. 2A apparatus.

FIG. 2B shows a more detailed view of the test environment 250 incorporated in the workstation 202. The test environment 250 includes modules 251 for implementing a user interface (see, for example, FIGS. 3A through 3D). This is done by customizing a test generation tree bar 254, a test execution tree bar 256, a test documentation tree bar 258, and a web browser 252. The customizing of the tree bars 254, 256, and 258, and the web browser 252, is preferably accomplished using commercially available software development tools such as the VISUAL STUDIO® development tools, sold by MICROSOFT® Corporation, Redmond, Wash., USA.

In the preferred embodiment, interface leaflets 260 and 261 integrate the test generation tree bar 254 with the test generation tool 104 and the simulator 108, respectively. Further, another interface leaflet 262 may integrate the tree bar 254 with another tool as shown in FIG. 2B. Similarly, interface leaflets 264, 265, and 266 integrate the test execution tree bar 256 with the drivers 120, 122, and 124, respectively. In this embodiment, the controller module 106 is omitted from the software configuration 201, and the modules 251 implement the user interface as shown in FIGS. 3A through 3D.

In another embodiment, the controller module 106 is included in the software configuration 201. Accordingly, an interface leaflet 263 integrates the test generation tree bar 254 with the controller 106, and an interface leaflet 267 integrates the test execution tree bar 256 with the controller 106. In this embodiment, the controller 106 interfaces with at least one test generation tool, the simulator 108, and the drivers 120, 122, and 124 as shown in FIG. 2B. Further, the controller 106, which may be implemented using a commercially available graphical programming system such as the LabVIEW® or the HP VEE™ systems, implements a user interface such as the user interface shown in FIG. 3E.

The interface leaflets 260 through 267 can be viewed as software used to "glue" the tree bars 254 and 256 to the known software modules 104, 106, 108, 120, 122, and 124, thereby facilitating the interaction of the tree bars with these software modules. Those skilled in this art sometimes call such software "middleware."

This illustrates the flexibility that can be achieved with the test environment 250. The modules 251 facilitate the development, execution, and documentation of test sequences and preferably implement the user interface. Further, the interface leaflets 260 through 267 allow the test generation tree bar 254 and the test execution tree bar 256 to interact with any known software module normally found in an automated test system, including those in application development environments implemented using commercially available graphical programming systems.

The tree bars 254, 256, and 258 are preferably implemented using a programming language that supports the creation of component-based software modules, such as VISUAL C++® or VISUAL BASIC®. This is because such component-based software modules generally have standard interfaces, and are therefore easily integrated with other software modules.

In the preferred embodiment, the tree bars 254, 256, and 258 are compiled software components or "objects" that conform to the MICROSOFT® component-object model (COM) interface specification. It is known to those skilled in this art that when a software application built using COM objects is executed, each COM object is instantiated in memory. Further, each instance of a COM object exposes its object structure to other software components or modules. The object structure of a COM object includes a set of functions known as "methods" and related data variables known as "properties." Other software components or modules can then make a COM object perform a desired operation by simply calling a corresponding method. The standard interface for COM objects such as the tree bars 254, 256, and 258 is therefore made up of these methods and properties.

In contrast, the software modules 104, 106, 108, 120, 122, and 124 typically do not have a standard interface. For example, the test generation tools might be implemented as a dynamic link library (DLL). Although a particular DLL presents a well-defined interface to other software modules, it is not a "standard interface." This means that different sets of tools might be implemented using different DLL's, each one having a different interface.

For this reason, the tree bars 254 and 256 communicate with the software modules 104, 106, 108, 120, 122, and 124 through the interface leaflets 260 through 267, which provide a standard interface for each of these software modules. The interface leaflets 260 through 267 each include a different set of methods with related properties that the tree bars 254 and 256 can call to make these software modules perform desired operations. Further, like the tree bars 254, 256, and 258, the interface leaflets 260 through 267 are preferably designed in accordance with the COM interface specification, and may be implemented using VISUAL C++® or VISUAL BASIC®.

Instead of using different interface leaflets to integrate the tree bars 254 and 256 with the software modules 104, 106, 108, 120, 122, and 124, each of these software modules might alternatively be partitioned into one or more COM objects. As a result, the tree bars 254 and 256 and the software modules 104, 106, 108, 120, 122, and 124 would all have standard interfaces, and the interface leaflets 260 through 267 would not be needed.

However, this approach would necessarily require substantial modifications of the software modules 104, 106, 108, 120, 122, and 124. We have discovered that any known software module normally found in an automated test system can be successfully integrated with the test environment 250 by simply providing an interface leaflet for that module. The test environment 250 can then make that module perform desired operations by simply calling the methods associated with the interface leaflet.

The test generation tree bar 254 and the test execution tree bar 256 may also communicate with leaflets 268 and 269, which are preferably stand-alone COM objects that may perform a variety of required test functions such as logging data acquired during testing of the UUT 112.

In the preferred embodiment, the test generation tree bar 254 provides a hierarchical representation of steps in the development of a test sequence. Similarly, the test execution tree bar 256 provides a hierarchical representation of steps in the execution of the test sequence, and the test documentation tree 258 provides a hierarchical representation of tester documentation.

Figure 3A:
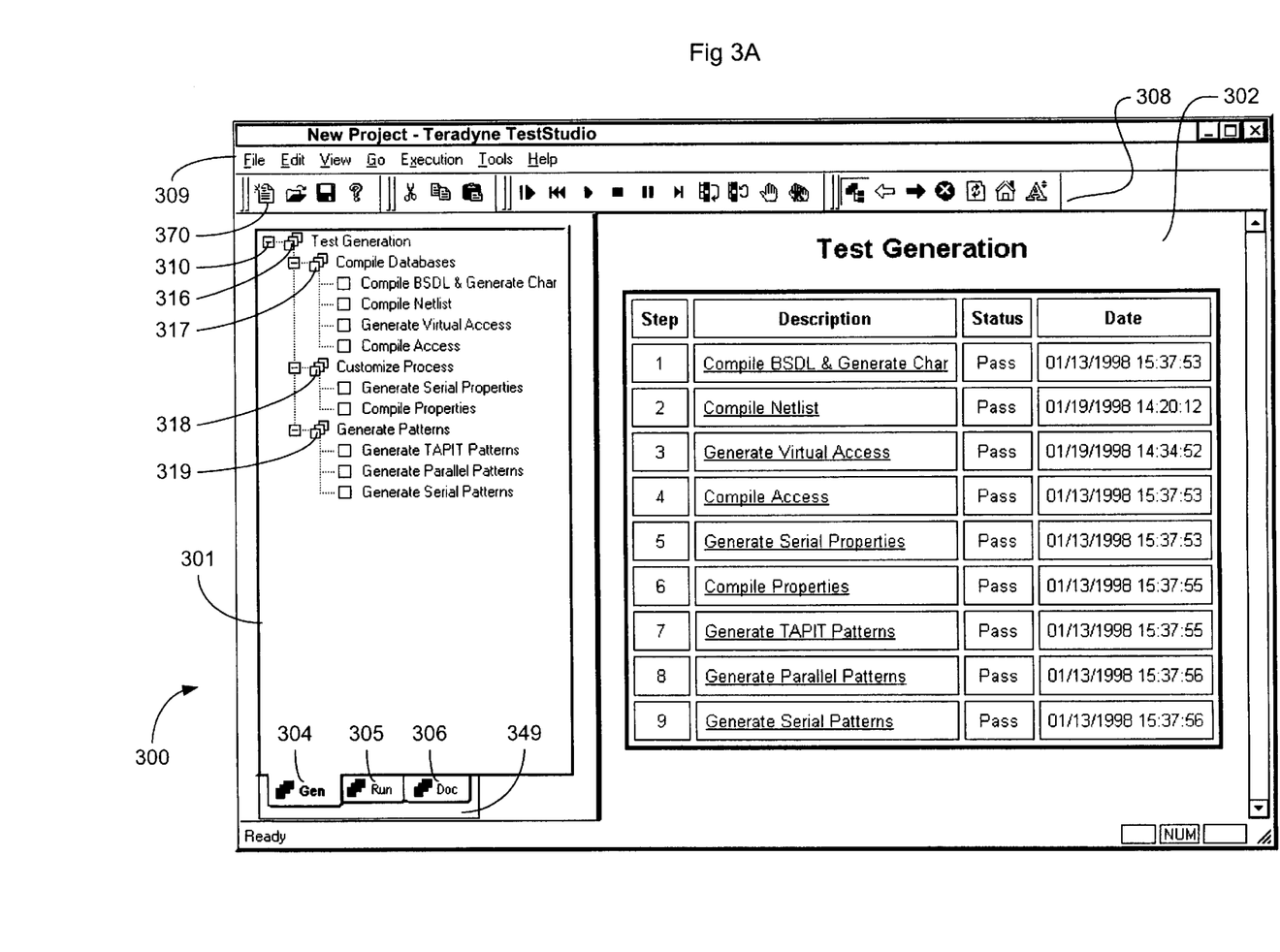
FIGS. 3A through 3E depict sample user interfaces used with the FIG. 2A apparatus.

In particular, each hierarchical representation is displayed to the tester operator as a hierarchical tree of nodes. As shown in FIG. 3A, a display 300 on the workstation 202 includes a sample tree of nodes 301, which visually represents the test generation tree bar 254. The display 300 is preferably implemented using the VISUAL STUDIO® Development Tools.

The tester operator, most likely a test engineer, sets up sequences of steps in both the development and execution of a test by creating hierarchical trees of nodes. For example, the sample tree of nodes 301 is meant to include a sequence of steps in the development of a test for UUT 112.

In particular, the tree 301 includes a root node represented by an icon 316. There can only be one root node in a tree of nodes. Further, each node, including the root node, can be visually expanded by selecting its associated icon using any appropriate input device, such as a keyboard or mouse. For example, the root node represented by the icon 316 is shown visually expanded to display nodes represented by icons 317, 318, and 319.

Because the root node is shown visually expanded, a minus (−) sign 310 is displayed to the left of the root node. When the icon 316 is de-selected, the icons 317, 318, and 319 will no longer be displayed and a plus (+) sign will replace the minus sign 310. Such indications of whether or not a node is visually expanded are meant to be illustrative.

The node represented by the icon 317 is also shown visually expanded, thereby displaying "end leaves" that correspond to functions for compiling databases; e.g., compiling a BSDL file, compiling a netlist, generating virtual access, and compiling access. End leaves cannot be visually expanded. Further, each end leaf corresponds to one of the methods included in the interface leaflets 260 and 261. The test generation tree bar 254 calls these methods to perform the functions included in the test generation tools (FIG. 2B).

Similarly, the node represented by the icon 318 is shown visually expanded, thereby displaying end leaves that correspond to functions for customizing a process; e.g., generating serial properties, and compiling the properties. Further, the node represented by the icon 319 is shown visually expanded, thereby displaying end leaves that correspond to functions for generating test patterns; e.g., generating TAPIT patterns, generating parallel patterns, and generating serial patterns. These functions, which are meant to be illustrative, are also included in the test generation tools.

Accordingly, the steps in the development of a typical test sequence are represented by the end leaves displayed under the visually expanded icons 317, 318, and 319. This means that the development of the test sequence can be specified by simply creating a tree of nodes such as the tree 301. Further, the functions included in the test generation tools can be easily accessed and organized through the test generation tree bar 254.

Information about the steps in the development of the test sequence can be displayed in a region 302 of the display 300. In the preferred embodiment, the region 302 represents the graphical interface of the web browser 252, which may be the INTERNET EXPLORER™ web browser made by MICROSOFT® Corporation. Accordingly, the information relating to the steps in the test sequence may be stored as an HTML document, preferably a dynamic HTML document, and the nodes of the tree 301 may be hypertext links to the dynamic HTML document. Such HTML documents, which are also known as "web pages," may be displayed in the region 302 using the web browser 252.

As shown in FIG. 3A, the test engineer can select one of the nodes of the tree 301, such as the root node represented by the icon 316, using the keyboard or mouse. This preferably accesses a dynamic HTML document that looks at the object structure of each end leaf under the visually expanded icons 317, 318, and 319, and then displays information about all of the steps in the test development sequence. This information is displayed in the region 302.

For example, steps 1 through 4 displayed in the region 302 correspond to the end leaves under the icon 317; steps 5 and 6 correspond to the end leaves under the icon 318; and, steps 7 through 9 correspond to the end leaves under the icon 319. Information relating to the status of each step and the date/time each step was executed may also be displayed in the region 302. All of the information displayed for the steps 1 through 9 can be accessed and displayed through the dynamic HTML document using existing web technology.

Further, if the test engineer alternatively selects one of the nodes represented by either the icon 317, 318, or 319, then information about the corresponding end leaves associated with just that icon would preferably be displayed in the region 302 through the dynamic HTML document.

However, if the test engineer selects one of the end leaves in the tree 301, such as an end leaf under the icon 317 (see FIG. 3D), then information about the properties associated with that end leaf is preferably displayed in the region 302 through another dynamic HTML document. This information will be described in detail below.

The display 300 has a tab field 349 (FIG. 3A) which includes tabs 304, 305, and 306 relating to the test generation tree bar 254, the test execution tree bar 256, and the test documentation tree bar 258, respectively. The test engineer can choose which tree bar is to appear on the display 300 by selecting one of the tabs 304 through 306. The tab 304 is shown enlarged to indicate that it has been selected, thereby displaying the tree 301 representing the test generation tree bar 254.

Figure 3B:
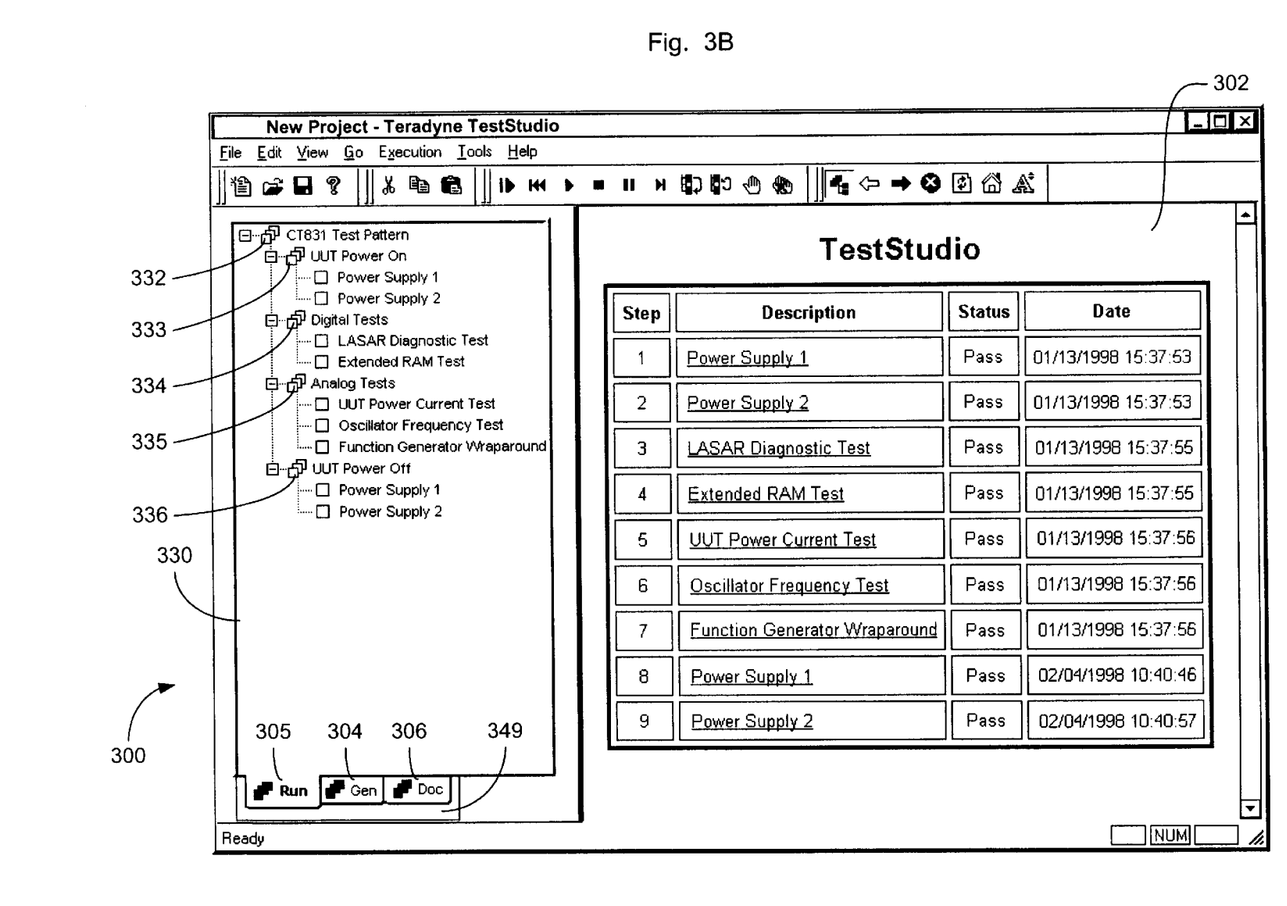

If the test engineer selects the tab 305, then a tree of nodes 330 representing the test execution tree bar 256 appears on the display 300, as shown in FIG. 3B. In particular, the tree 330 includes a root node represented by an icon 332, which is shown visually expanded to display nodes represented by icons 333 through 335. The tab 305 is shown enlarged to indicate that it has been selected.

The node represented by the icon 333 is also shown visually expanded, thereby displaying nodes that correspond to functions for applying power to the UUT 112; e.g., turning-on power supply 1, and turning-on power supply 2.

Further, the node represented by the icon 334 is shown visually expanded, thereby displaying nodes that correspond to functions for performing digital tests; e.g., performing diagnostic tests and extended RAM tests. Also, the node represented by the icon 335 is shown visually expanded, thereby displaying nodes that correspond to functions for performing analog tests; e.g., performing a power current test on the UUT 112, performing an oscillator frequency test, and performing a function generator wrap-around. The tree 330 can therefore be used to group steps relating to the digital tests and the analog tests together.

Also, the node represented by the icon 336 is shown visually expanded, thereby displaying nodes that correspond to functions for removing power from the UUT 112, e.g., turning-off power supply 1 and turning-off power supply 2. These functions, which are also meant to be illustrative, are typically included in the drivers 120, 122, and 124.

Each of the nodes corresponding to the functions for applying power, performing digital tests, performing analog tests, and removing power, shown under the visually expanded icons 333 through 336, respectively, is an end leaf of the tree 330. Further, each of these end leaves corresponds to one of the methods included in the interface leaflets 264, 265, and 266. The test execution tree bar 256 calls these methods to perform the functions included in the drivers 120, 122, and 124. This means that the execution of the test sequence can be easily specified by creating a tree of nodes such as the tree 330.

As shown in FIG. 3B, the test engineer can select one of the nodes of the tree 330, such as the root node represented by the icon 332, using the keyboard or mouse. This preferably accesses still another dynamic HTML document that lists all of the steps in the test execution sequence, and the status and date/time information for each step. These steps correspond to each group of end leaves under the visually expanded icons 333 through 336. FIG. 3B shows this document in the region 302.

Figure 3C:
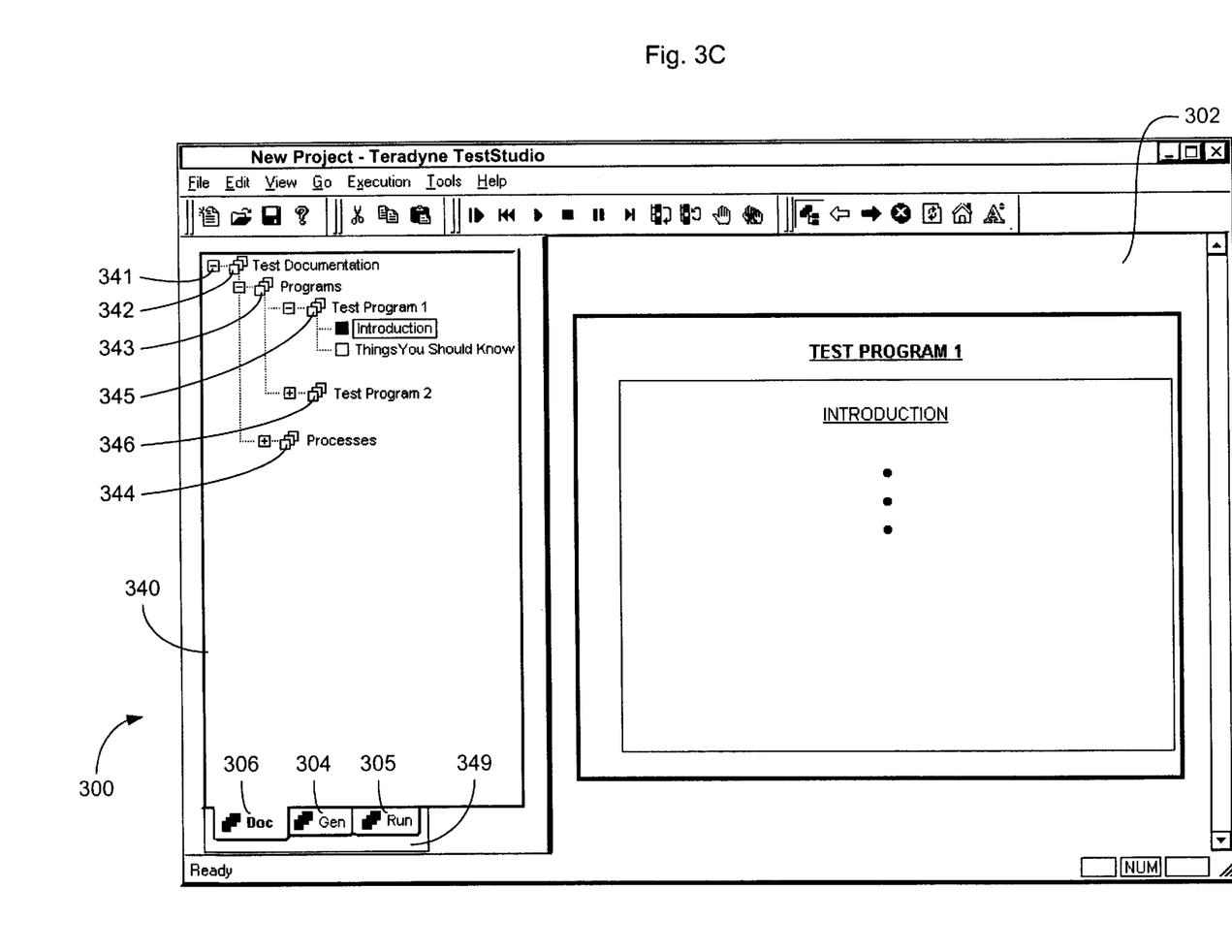

If the tester operator selects the tab 306, then a tree of nodes 340 representing the test documentation tree bar 258 appears on the display 300, as shown in FIG. 3C. In particular, the tree 340 includes a root node represented by an icon 342, which is shown visually expanded to display nodes represented by icons 343 and 344 relating to PROGRAMS and PROCESSES, respectively.

The node represented by the icon 343 is also shown visually expanded, thereby displaying nodes represented by icons 345 and 346. Further, the icon 345 is shown visually expanded. The nodes 342 through 346 preferably represent manuals, chapters, or sections of tester documentation relating to PROGRAMS. In contrast, the end leaves under the visually expanded icon 345 preferably represent at least one page of information in the tester documentation relating to PROGRAMS.

Whereas the end leaves of the trees 301 and 330 correspond with one of the methods included in the interface leaflets 260 through 267, the end leaves of the tree 340 do not correspond to any such methods. Instead, they correspond to pages of information in the tester documentation.

Accordingly, the information relating to each end leaf of the tree 340 is preferably stored as yet another HTML document, and the end leaves are hypertext links to the HTML documents. This information can be displayed in the region 302 of the display 300. For example, the test engineer can select one of the end leaves of the tree 340, such as the INTRODUCTION end leaf, for viewing pages of the tester documentation in the region 302 (FIG. 3C).

As mentioned above, the tree bars 254, 256, and 258 and the leaflets 260 through 269 are preferably COM objects. This means that the tree bars and the leaflets can be made to perform desired operations by calling respective methods, each of which make reference to one or more properties. Each property preferably consists of a name-value pair, and can be used for controlling a test sequence.

In the preferred embodiment, the properties for the test generation tree bar 254 and the test execution tree bar 256 are associated with the nodes and end leaves of the trees 301 and 330, respectively. In particular, each node or end leaf has at least one associated property. Also, most of the properties associated with a tree of nodes are hierarchical; i.e., most of the properties are inherited from parent nodes to child nodes. This means that if a node or end leaf does not have a particular associated property, it will inherit that property from the closest ancestor node having the property. Nodes and/or end leaves with common properties can therefore be easily specified.

Further, each node or end leaf can access a hypertext link to a dynamic HTML document for displaying information relating to its associated properties. This property information is displayed in the region 302 of the display 300. In the preferred embodiment, this hypertext link is activated by moving the cursor to a particular node or end leaf and then using either a mnemonic key or a mouse to access a pop-up menu. The dynamic HTML document containing the property information for that node or end leaf can then be selected from the pop-up menu.

Figure 3D:
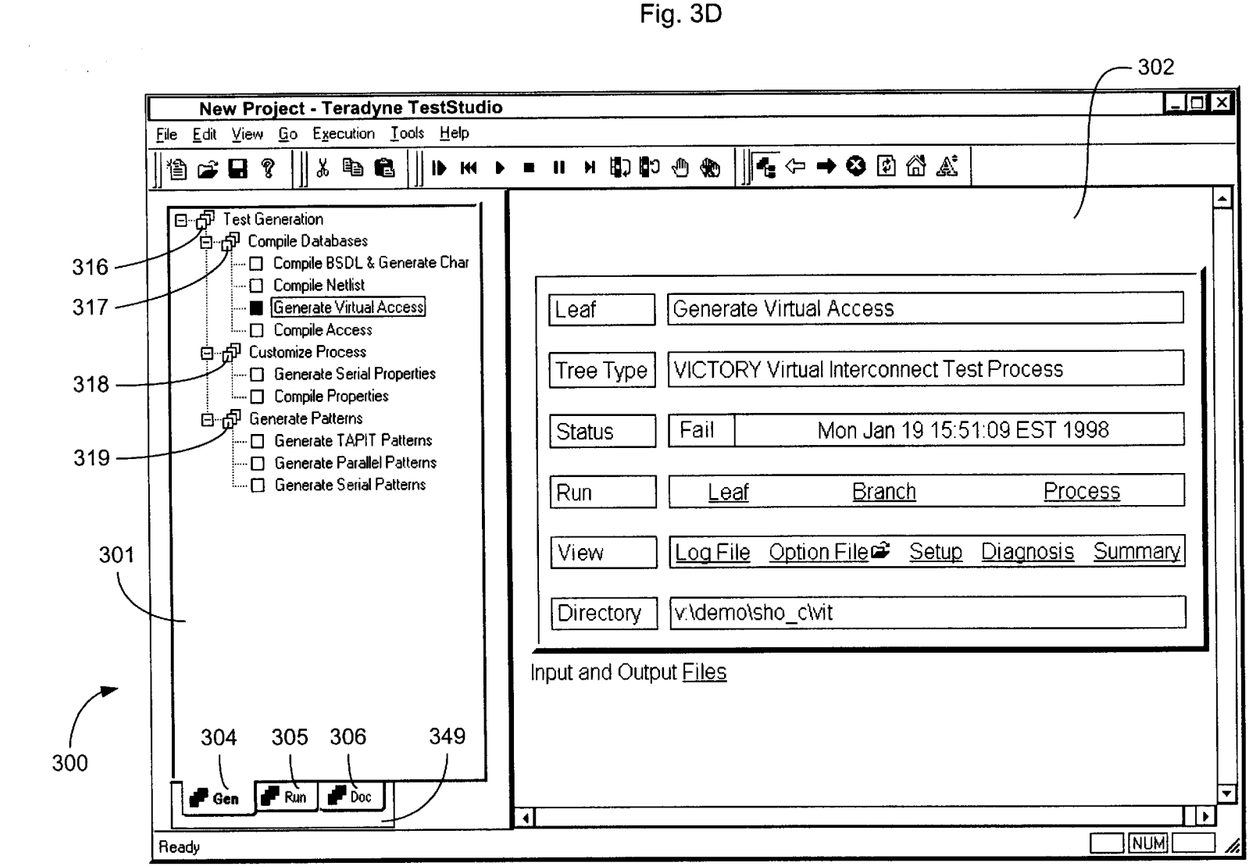
Figure 3E:
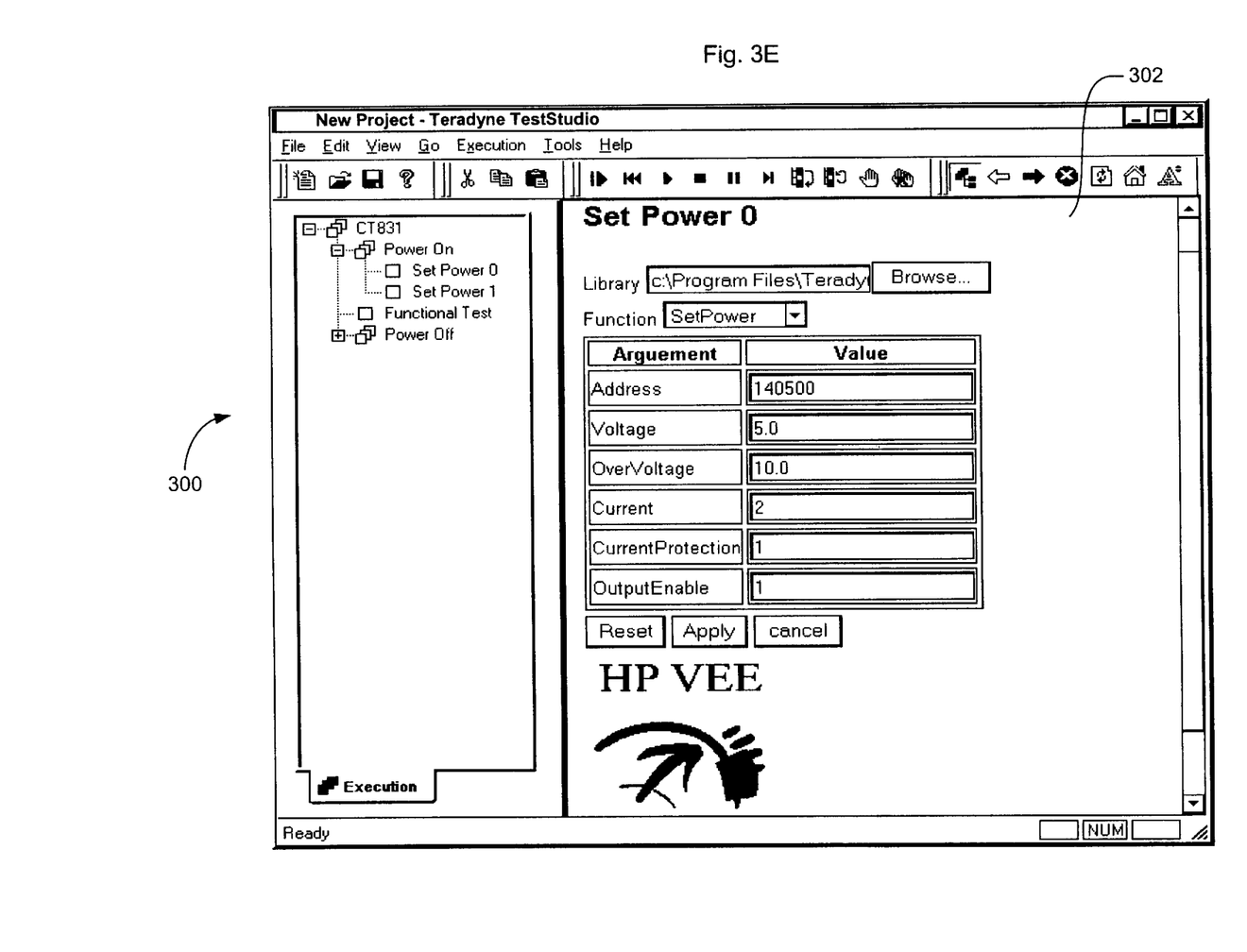

For example, the region 302 of FIG. 3D displays property information associated with the end leaf corresponding with the function for generating virtual access. This property information includes an "end leaf name" property, which may have a name "LeafName" and a value indicating "Generate Virtual Access;" a "tree type" property, which may have a name "TreeType" and a value indicating "VICTORY™ Virtual Interconnect Test Process;" a "status" property, which may have a name "PassFail" and a value indicating that the end leaf has been executed and has either passed or failed; a "last run time" property, which may have a name "LastRunTime" and a value indicating the last date and time a corresponding method was run; a "select run" property, which may have a name "RunSelection" and a value indicating what part of the tree including this end leaf is to be executed (for example, just this end leaf, just the branch extending from the icon 317, or all of the steps in the tree 301); a "view file" property, which may have a name "ViewFile" and a value indicating what HTML file relating to this end leaf is being displayed; and, a "directory" property, which may have a name "ShowDirectory" and a value indicating the directory where this HTML file is located.

The region 302 of FIG. 3D also displays a hypertext link to input and output files for the end leaf. Accordingly, an "input file" property may have the name "InputFile" and a value indicating the files needed by the end leaf during execution. Similarly, an "output file" property may have the name "OutputFile" and a value indicating the files created by the end leaf during execution.

In the preferred embodiment, the properties associated with each node or end leaf in the trees 301 and 330 further include a "primary URL" property, which may have a name "PrimaryURL" and a value indicating the address of a related HTML document. The primary URL may be a "file URL," which specifies an HTML document stored in the local memory of the workstation 202. Preferably, the primary URL is a "complete URL" specifying the protocol, host name, port, and path of the HTML document. This allows the retrieval and subsequent display of a web page stored on another tester that is connected to the workstation 202 through either an internal network or the Internet. Accordingly, the tester 200 and the other tester are preferably implemented as web servers with the software necessary to interface with a network.

For example, the primary URL property associated with each end leaf in the test documentation tree 258 provides the address of a web page representing at least one page in the tester documentation. FIG. 3C shows the selected end leaf INTRODUCTION, and a page of tester documentation in the region 302. The page of tester documentation is meant to be illustrative. Also, the primary URL property associated with each node of the test generation tree 301 and the test execution tree 330 provides the address of a web page containing the property information for that node.

The properties associated with each end leaf of the trees 301 and 330 also preferably include a "development step" property and an "execution step" property, respectively. For example, the development step property may have a name "DevelopmentStep" and a value indicating the method to be called when an end leaf in the test development sequence is executed. Similarly, the execution step property may have a name "ExecutionStep" and a value indicating the method to be called when an end leaf in the test execution sequence is executed. As mentioned above, these methods are included in the interface leaflets 260 through 267 and correspond with functions in the software modules 104, 106, 108, 120, 122, and 124.

The end leaf name property, the tree type property, the select run property, the view file property, the directory property, the input file property, the output file property, the primary URL property, the development step property, and the execution step property for each node or end leaf can be added, deleted, or modified. This is preferably done through scripts associated with the dynamic HTML documents used to display the property information. Other user-defined properties may also be added, deleted, or modified in a similar manner. However, the status property and the last run time property are "read-only" and cannot be modified.

As an illustrative example, an end leaf in the tree 330 may have an execution step property that makes reference to a method in the leaflet 268 or 269 for logging data acquired during testing of the UUT 112. Accordingly, the end leaf may also have output file properties with values that indicate paths to files for storing the data. The test engineer might therefore rename these files MIN, MAX, and ACTUAL to facilitate the data logging.

The properties associated with each node or end leaf of the trees 301 and 330 also preferably include properties for controlling test program flow. These properties can also be added, deleted, or modified. In the preferred embodiment, the flow control properties cannot be inherited from parent nodes to child nodes or end leaves. Accordingly, when a flow control property is added to a node or end leaf, it can be viewed as being "attached" to that node or end leaf.

The flow control properties include an "inlet" property and an "outlet" property. One or more inlet and outlet properties may be added to each parent node or end leaf in the test generation and execution trees. Further, the values of inlet and outlet properties indicate methods to be called for performing desired functions. These methods may be associated with any of the leaflets 260 through 269.

Figure 2C:
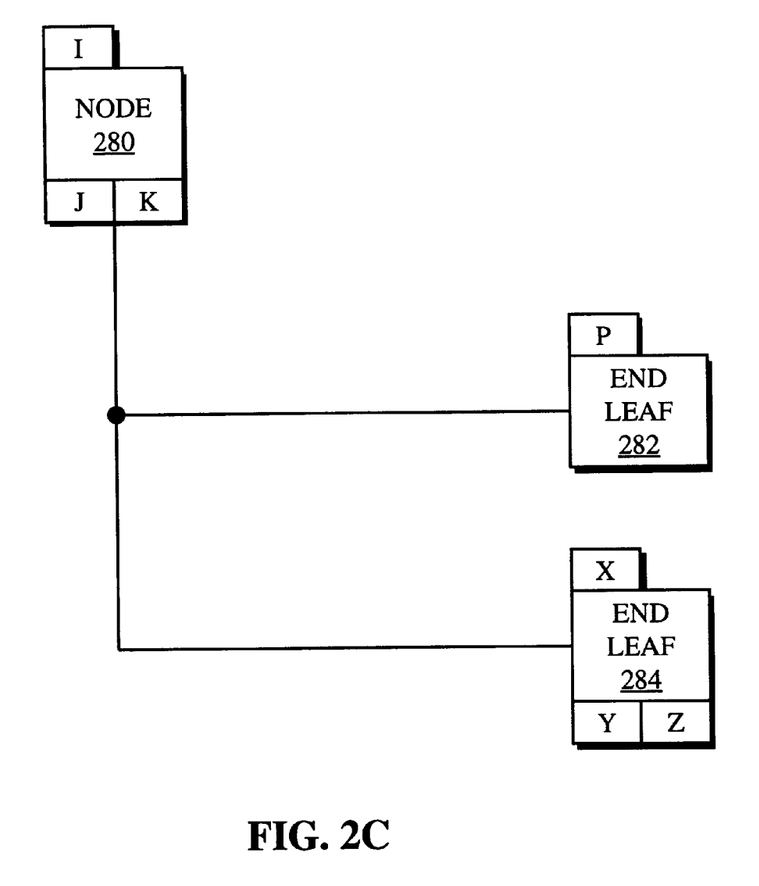
FIG. 2C is a block diagram describing inlet and outlet properties in accordance with the present invention.

FIG. 2C is useful for describing the operation of inlet and outlet properties. In particular, a node 280, an end leaf 282, and an end leaf 284 are meant to represent a portion of either the tree 301 or 330. Further, the node 280 represents a parent node such as the node 317, 318, or 319 of the tree 301, or the node 333, 334, 335, or 336 of the tree 330. Also, the end leaves 282 and 284 represent any two end leaves associated with the node 317, 318, or 319 of the tree 301, or the node 333, 334, 335, or 336 of the tree 330.

In this illustrative example, the test engineer adds an inlet property I and outlet properties J and K to the node 280. Similarly, an inlet property P is added to the end leaf 282 and an inlet property X and outlet properties Y and Z are added to the end leaf 284. The values of the inlet properties I, P, and X and the outlet properties J, K, Y, and Z each represent a method to be called for performing a desired function. The test engineer also adds either a development step property or an execution step property to the end leaves 282 and 284. The values of these properties also represent methods to be called for performing desired functions. It should be noted that the inlet properties I, P, and X and the outlet properties J, K, Y, and Z are not actually displayed with their corresponding nodes on the user interface 300 as shown in FIG. 2C.

Accordingly, when this portion of the tree 301 or 330 is executed, the function referenced by the inlet I is run first. Next, the function referenced by the inlet P is run followed by the function referenced by the end leaf 282. The function referenced by the inlet X is then run, followed by the functions referenced by the end leaf 284, the outlet Y, and the outlet Z. Finally, the functions referenced by the outlets J and K are run. It is important to note that parent nodes, such as the node 280, do not make reference to any methods or functions.

This means that functions referenced by inlets associated with parent nodes (e.g., the node 280) are run before any functions referenced by their child nodes (e.g., the end leaves 282 and 284). Further, functions referenced by outlets associated with parent nodes are run after the functions referenced by their child nodes. Also, functions referenced by end leaves at the same hierarchical level, each of which may have associated inlets and/or outlets, are run in a sequential order. The flexibility that can be achieved by adding inlet and outlet properties to nodes and/or end leaves of a hierarchical tree of nodes constitutes still another advantage of the present invention.

In a typical test session, test signals and test sequences can be developed, debugged, and executed using the user interface implemented by the test environment 250 (FIG. 2B) as follows. First, a tester operator, most likely a test engineer, creates a new test pattern set (TPS) project by selecting NEW on the system File menu (not shown), which is located in a menu bar field 309 on the display 300 as shown in FIG. 3A. The test engineer might alternatively create a new TPS project by selecting a NEW tool 370, which is located in a tool bar field 308 on the display 300. The standard placement and operation of the menu bar field 309 and the tool bar field 308 make the user interface of the present invention very easy to use.

A "new item" dialog box (not shown) then appears listing the following three items that the test engineer can choose to create: a new TPS project, a new sub-project (which is a new branch on an existing tree of nodes), and a new tree of nodes. The test engineer selects the new TPS project item, thereby reserving space in memory for the new project, and clears the regions of the display 300 corresponding to the region for displaying the trees 301 and the graphical interface 302.

Next, the test engineer adds a new tree to the created TPS project by once again selecting NEW on the system File menu, thereby generating the "new item" dialog box. The test engineer then selects the new tree item, which creates and displays a root node, such as the root node represented by the icon 316, and a tab, such as the tab 304. This new tree typically represents the test generation tree bar 254 (FIG. 2B). Other items on the system File menu include OPEN, which opens an existing TPS project file; CLOSE, which closes the current project; and, SAVE, which saves a modified TPS project.

The test engineer then adds nodes to the new tree by first selecting the root node and then selecting ADD CHILD on the system Edit menu (not shown), which is also located in the menu bar field 309. This creates and displays a node below the selected root node, such as the node represented by the icon 317. Other items on the system Edit menu include DELETE, which deletes a selected node; RENAME, which renames a selected node; INSERT, which creates and displays a node above a selected node other than the root node; and, NODE PROPERTIES, which accesses the property information for a selected node.

Alternatively, the test engineer may add a new branch to the new tree, and then add nodes to the new branch. As mentioned above, a new branch can be added to an existing tree by selecting the "new sub-project" item in the "new item" dialog box.

Next, the test engineer associates methods with end leaves on the newly created tree by either adding or modifying the "development step" property as described above. These methods correspond with functions included in software modules such as the test generation tool 104 and the simulator 108. Further, the property information for a selected end leaf can be accessed from the system Edit menu.

The test engineer then creates another tree in the same TPS project that represents the test execution tree bar 256. This tree is created and modified in the same manner as the tree representing the test generation tree bar 254 with one exception; i.e., the test engineer associates methods with end leaves on this tree by either adding or modifying the "execution step" property, as also described above. These methods correspond with software modules such as the drivers 120, 122, and 124.

Next, the test engineer preferably edits the property information for the nodes and end leaves in the trees representing both the test generation tree bar 254 and the test execution tree bar 256. As described above, properties for each node and end leaf can be added, deleted, or modified through the dynamic HTML document containing the property information.

In particular, the test engineer may edit some of the hierarchical properties. For example, the test engineer may add a user-defined property with the name "Datalog" and the value "false" to the node represented by the icon 334 on the test execution tree 330 (FIG. 3B), which corresponds to the digital tests to be performed on the UUT 112. This property may be used as a flag for controlling data logging functions. Because such user-defined properties are inherited from parent nodes to child nodes, both of the end leaves under the node relating to the digital tests also have this property.

Similarly, the test engineer may add another user-defined property with the name "Datalog" and the value "true" to the node represented by the icon 335 on the test execution tree 330 (FIG. 3B), which corresponds to the analog tests to be performed on the UUT 112. Because this property is also inherited from parent nodes to child nodes, all three of the end leaves under the node relating to the analog tests also have this property.

Accordingly, the end leaves under the nodes relating to the digital and analog tests may perform functions for logging data depending upon the value of these user-defined properties.

The test engineer can also edit the properties relating to the control of test program flow at this stage of the test session. For example, the test engineer may add inlet and/or outlet properties to any node or end leaf in the test generation tree 301 or the test execution tree 330.

The next task of the test engineer during the typical test session is to debug the newly created test development and execution trees 301 and 330. In particular, the test engineer can select LOOP PROPERTIES on the system Execution menu (not shown), which is located in the menu bar field 309, thereby causing a "loop properties" dialog box (not shown) to appear. This dialog box lists several items including START NODE, which specifies the node at which to start executing a selected tree; and, END NODE, which specifies the node at which to stop executing the selected tree. The names of the "start" and "stop" nodes can be specified in the dialog box by simply inserting the node names. For example, the test engineer might insert the node name COMPILE DATABASES (FIG. 3A) for specifying the node at which to start execution.

The specified "start" and "stop" nodes can also define a loop. Accordingly, the "loop properties" dialog box includes items for specifying whether or not to repeat the loop. For example, the dialog box includes PASS and FAIL radio buttons, which specify that the loop should be repeated if all methods in the loop complete successfully, or if any methods in the loop do not complete successfully, respectively.

Further, the test engineer can debug the newly created trees by selecting any of the following items on the system Execution menu: CONTINUE, which continues execution from the next end leaf after a selected node; RUN THIS NODE, which runs only a selected node including any child end leaves; RUN NEXT LEAF, which advances to the next end leaf and runs only that end leaf; and, BREAK, which sets or clears a breakpoint on a selected node.

While creating and debugging the test development and execution trees 301 and 330, the test engineer may also perform the following actions, which are also accessed through the menu bar field 309. For example, the test engineer may change the contents and appearance of the display 300 by selecting items on the system View menu (not shown), including TREE BAR, which turns the display of a tree bar "on" and "off;" STOP, which halts the downloading of an HTML document to the web browser 204; and, REFRESH, which reloads the contents of the graphical interface 302.

Also, the test engineer may control the web browser 204 by selecting items on the system Go menu (not shown), including NAVIGATE, which prompts for a web page address and then navigates to the supplied address; BACK, which navigates to a previous web page, if any; FORWARD, which navigates to the next web page, if any; HOME, which navigates to a specified "home" web page; and PROJECT HOME, which navigates to a specified web page that lists all TPS projects.

After the trees are created and debugged, the test engineer preferably creates another tree in the same TPS project that represents the test documentation tree bar 258. This tree is created and modified in the same manner as the trees representing the test generation tree bar 254 and the test execution tree bar 256. However, the end leaves of this tree correspond with pages of user documentation instead of functions included in the software modules 104, 106, 108, 120, 122, and 124. The test engineer associates pages of user documentation with the end leaves by editing the "primary URL" property for each end leaf in the tree.

Next, another tester operator, most likely a production worker, runs the newly created test development and execution trees 301 and 330. First, the production worker chooses a test program to run by selecting OPEN on the system File menu, thereby causing an "open" dialog box (not shown) to appear. This dialog box lists the test programs included in each defined TPS project. The production worker then selects the desired test program, which corresponds to one of the newly created trees.

The production worker then runs the selected test program by selecting RUN on the system Execution menu. When the selected test program is run, the steps specified in the corresponding tree are run in sequence, starting with the root node and continuing with the child nodes until all end leaves in the hierarchical tree are executed. The production worker can also halt the execution of the selected test program by selecting STOP on the system Execution menu.

Having described one embodiment, numerous alternative embodiments or variations might be made. For example, it was described that FIG. 2A is an automated test system built with individual instruments. However, this is merely an illustration. It should be understood that the present invention could be used with any tester architecture.

Also, it was described that the tree bars 254, 256, and 258, the interface leaflets 260 through 267, and the stand-alone leaflets 268 and 269 are software components conforming with the MICROSOFT® COM interface specification. It was also described that such COM objects are easily integrated with each other and with other software modules on a single computer; e.g., the workstation 202. However, this is also merely an illustration. These software components can also be integrated with software modules residing on other computers across a network, such as a corporate Intranet or the Internet.

Figure 4:
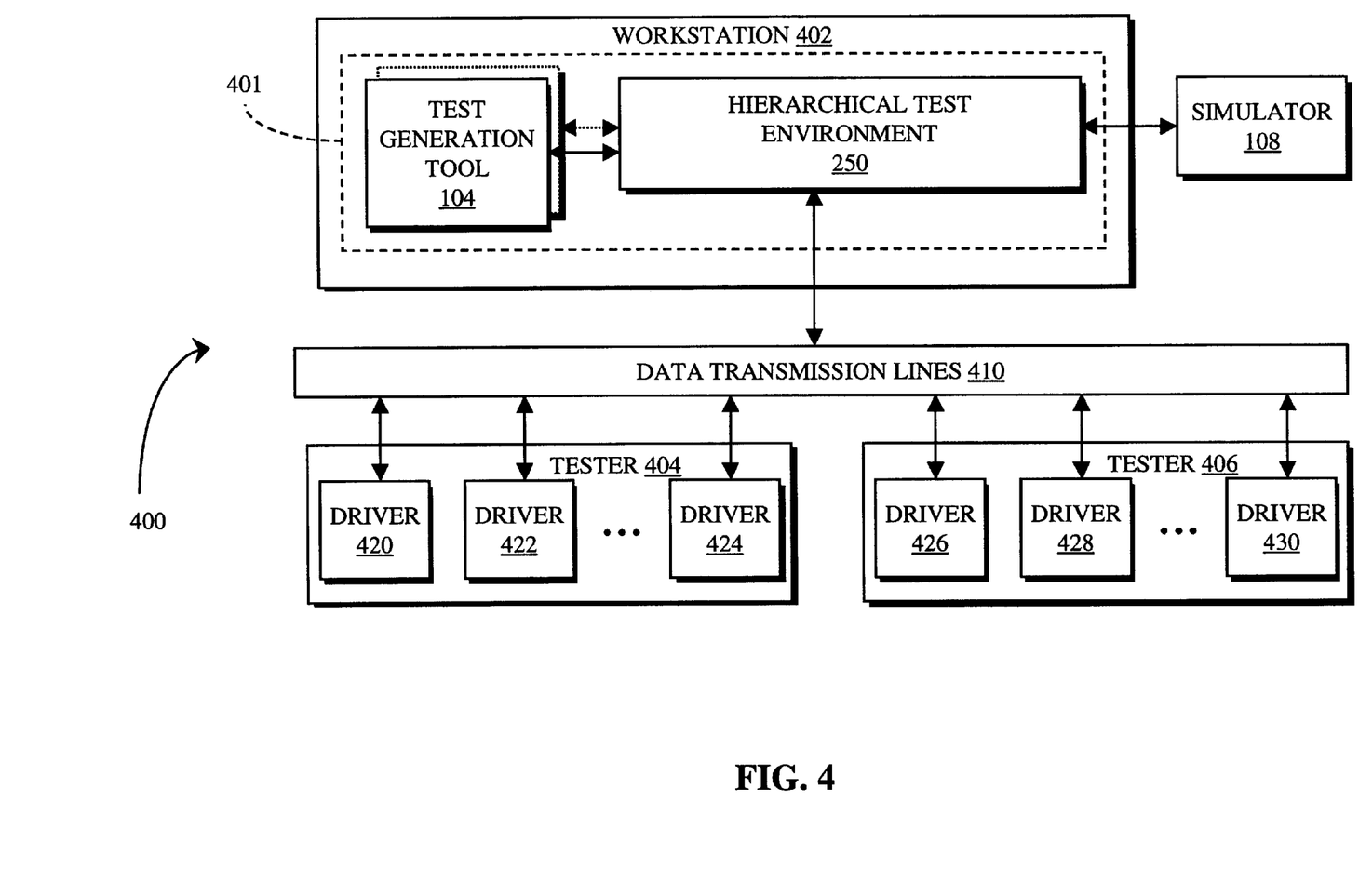
FIG. 4 is a block diagram of a distributed system using the FIG. 2A apparatus.

FIG. 4 shows a system 400 including a workstation 402, which transfers data with a plurality of testers 404 and 406 through data transmission lines 410. Such data transfers may be accomplished using the MICROSOFT® ActiveX™ inter-component data transfer mechanism.

As described above, the data transmission lines 410 may be connected to a corporate Intranet or the Internet. This means that the workstation 402 may be implemented as a client and the testers 404 and 406 may be implemented as web servers with the software necessary to interface with the network. Alternatively, proxy servers (not shown) might be used to interface the workstation 402 and/or the testers 404 and 406 with the data transmission lines 410. Further, the workstation 402 and the testers 404 and 406 may transfer data over the data transmission lines 410 using a common protocol. For example, if the data transmission lines 410 are connected to a network, then the TCP/IP protocol may be used.

In a preferred embodiment, the hierarchical test environment 250 and the test generation tools 104 reside in the workstation 402. Further, the drivers 420, 422, and 424 reside in the tester 404 and the drivers 426, 428, and 430 reside in the tester 406. Because the interface leaflets 260 through 267 included in the test environment 250 may be implemented as distributed COM objects, they can integrate the tree bars 254 and 256 with the drivers 420 through 430 across the network 410.

A test engineer develops and debugs test programs on the workstation 402 in the same manner as described above in the typical test session. However, the test engineer preferably transfers the data representing the tree of nodes 330 corresponding to the test execution tree bar 256 from the workstation 402 to selected ones of the testers 404 and 406 before running the test sequences, thereby replicating the tree 330 on the selected testers. This is because data is generally transferred between computers over a network by sending data packets to specified network addresses. Such a method of transferring data generally introduces delays that may not be desirable during the execution of test programs. Accordingly, the test engineer sends copies of the test tree 330 to the selected testers, thereby avoiding such delays during test execution.

Next, the production worker chooses a test program on the workstation 402 in the manner described above in the typical test session. The production worker may then select RUN on the system Execution menu on the workstation 402, which sends data to a corresponding tester, thereby causing the tester to run the chosen test sequence. Accordingly, the steps specified in the corresponding tree 330, which is now resident in the corresponding tester, are run in sequence until all end leaves in the tree 330 are executed. The ability to develop and debug test programs on a workstation located in one location, and then execute the test programs on testers located in other locations, by exploiting distributed component software and network technology, constitutes a substantial advantage of the present invention.

It will therefore be understood by those skilled in this art that additions, deletions, and modifications can be made to the preferred embodiment described herein, without departing from the spirit and scope of the appended claims.

What is claimed is:

1. Automatic test equipment, used to develop and execute a test program for verifying a circuit under test, comprising:

means for inputting data, including data for specifying a hierarchical tree of nodes, the tree of nodes including a root node and at least one group of end nodes descending from the root node
wherein each end node corresponds with one of a plurality of steps in the test program, at least one end node communicating with an instrument driver for controlling a test instrument, and
wherein the at least one group of end nodes corresponds with steps relating to a type of test to be performed on the electronic circuit;

programmable computer means coupled to the means for inputting data, including processing means responsive to the input data for producing graphic data representing the tree of nodes and execution means for executing, following a sequence prescribed by the tree of nodes, the steps in the test program; and graphic display means, coupled to the computer means, the display means being responsive to the graphic data for displaying an image of the tree of nodes.

2. The automatic test equipment as recited in claim 1, wherein each end node corresponds with one of a plurality of steps in a process for generating test signals.

3. The automatic test equipment as recited in claim 1, wherein each end node corresponds with one of a plurality of steps in a process for testing the electronic circuit.

4. The automatic test equipment as recited in claim 1, wherein each node in the tree of nodes corresponds with at least one data variable for controlling performance of at least one of the steps.

5. The automatic test equipment as recited in claim 4, wherein the tree of nodes further includes at least one intermediate node descending from the root node, and wherein data variables corresponding with the at least one intermediate node control the performance of at least one group of steps descending therefrom.

6. The automatic test equipment as recited in claim 4, wherein data variables corresponding with the root node control the performance of each group of steps.

7. The automatic test equipment as recited in claim 4, wherein the input data further includes data for selecting a node, and wherein the graphic display means is responsive to the data for selecting a node for displaying a window including a list of the corresponding data variables for the selected node.

8. The automatic test equipment as recited in claim 1, wherein the input data further includes data for selecting at least one group of steps in the test program to perform.

9. A tester including a plurality of instruments for applying test signals to a circuit under test and for measuring signals produced by the circuit under test, and a computer workstation for controlling the plurality of instruments, the computer workstation including software for generating the test signals and for controlling the plurality of instruments, the software comprising:

a plurality of test generation tools for facilitating the generation of the test signals;

a plurality of instrument drivers for controlling the plurality of instruments;

program means for inputting data relating to the generation of the test signals and for inputting data relating to the control of the instruments;

a first plurality of modules, each module in the first plurality for facilitating, data transfers between the program means for inputting test generation data and a respective test generation tool;

a second plurality of modules, each module in the second plurality for facilitating data transfers between the program means for inputting instrument control data and a respective instrument driver; and means, responsive to the program means for inputting data, for operating the plurality of test generation tools via the first plurality of modules and for operating the plurality of instrument drivers via the second plurality of modules;

wherein the test generation tools and the instrument drivers are software modules with non-standard interfaces and the first and second pluralities of modules provide standard interfaces for the respective tools and drivers.

10. The tester as recited in claim 9, wherein the first plurality of modules and the second plurality of modules are implemented as compiled software components.

11. The tester as recited in claim 10, wherein the first plurality of modules and the second plurality of modules are implemented as compiled software components conforming with the COM interface specification.

12. The tester as recited in claim 11, wherein the first and the second pluralities of modules each has a corresponding object structure including a set of functions and related data variables, and wherein the program means for inputting data and the tools and drivers exchange data by calling corresponding functions in the first and second pluralities of modules.

* * * * *